United States Patent
Hu

(10) Patent No.: US 8,848,438 B2
(45) Date of Patent: Sep. 30, 2014

(54) ASYMMETRIC LOG-LIKELIHOOD RATIO FOR MLC FLASH CHANNEL

(75) Inventor: Xinde Hu, San Diego, CA (US)

(73) Assignee: STEC, Inc., Santa Ana, CA (US)

(*) Notice: Subject to any disclaimer, the term of this patent is extended or adjusted under 35 U.S.C. 154(b) by 535 days.

(21) Appl. No.: 13/253,029

(22) Filed: Oct. 4, 2011

(65) Prior Publication Data

US 2012/0236641 A1 Sep. 20, 2012

Related U.S. Application Data

(60) Provisional application No. 61/390,100, filed on Oct. 5, 2010.

(51) Int. Cl.
*G11C 16/04* (2006.01)
*G11C 11/56* (2006.01)
*G11C 16/26* (2006.01)

(52) U.S. Cl.
CPC ............ *G11C 16/26* (2013.01); *G11C 11/5642* (2013.01)
USPC .................. 365/185.03; 365/200; 365/189.15

(58) Field of Classification Search
CPC . G11C 11/5642; G11C 16/0441; G11C 16/26
USPC .................................. 365/185.03, 200, 189.15
See application file for complete search history.

(56) References Cited

U.S. PATENT DOCUMENTS

| | | | |
|---|---|---|---|
| 2010/0091535 A1* | 4/2010 | Sommer et al. | 365/45 |
| 2011/0305082 A1* | 12/2011 | Haratsch et al. | 365/185.03 |
| 2012/0297270 A1* | 11/2012 | Shalvi et al. | 714/763 |
| 2012/0320672 A1* | 12/2012 | Meir et al. | 365/185.03 |
| 2014/0112077 A1* | 4/2014 | Ish-Shalom et al. | 365/185.18 |

OTHER PUBLICATIONS

Vasic et al., "Structured Low-Density Parity-Check Codes", Coding and Signal Processing for Magnetic Recording Systems, Chapter 38, CRC Press 2005.

* cited by examiner

*Primary Examiner* — Tuan T Nguyen
(74) *Attorney, Agent, or Firm* — McDermott Will & Emery LLP

(57) ABSTRACT

Disclosed is an system and method for reading a flash memory cell with an adjusted read level. A current read level is adjusted to a new read level associated with increasing a first error rate to decrease a second error rate. The first error rate is associated with determining that the most significant bit of the flash memory cell is a binary 1 and the second error rate is associated with determining that the most significant bit is a binary 0. On reading the memory cell, a probability value is generated for the most significant bit, the probability being higher if the bit is equivalent to a binary 0 than if the bit is equivalent to a binary 1.

24 Claims, 6 Drawing Sheets

ASYMMETRIC LOG-LIKELIHOOD RATIO FOR MLC FLASH CHANNEL

CROSS-REFERENCES TO RELATED APPLICATIONS

This application claims priority from U.S. Provisional Application No. 61/390,100, filed Oct. 5, 2010, which is incorporated herein by reference in its entirety.

TECHNICAL FIELD

The subject technology relates generally to memory devices and in particular multi-level cell flash memory devices.

BACKGROUND

Lower priced Solid State Drives (SSD) are typically manufactured using multi-level cell (MLC) flash memory for increased data capacity, but MLC is less reliable than single-level cell (SLC) flash memory. Consumer SSD manufacturers have mitigated reliability problems by employing interleaving and/or providing excess capacity in conjunction with wear-leveling algorithms. MLC flash endurance, however, has not been proven acceptable for enterprise SSD applications. Even with the increased data capacity of MLC, using MLC in enterprise applications becomes more expensive because of its disproportionately large decrease in program/erase (P/E) cycles over time due to increased (wear causing) stresses required to read, program and erase the flash, causing a gradual degradation in endurance.

SUMMARY

A system and method for reading a flash memory with an adjusted read level is disclosed. According to one aspect, a computer-implemented method may include identifying a current read level associated with determining a most significant bit in a plurality of multi-level memory cells, setting the current read level to a new read level associated with increasing a first error rate, the first error rate associated with determining that the most significant bit is a first binary value, to decrease a second error rate associated with determining that the most significant bit is a second binary value, reading a memory cell with the new read level to determine a most significant bit value of the memory cell, determining a probability value associated with the most significant bit value, and providing the most significant bit value and the probability value to a decoder.

In another aspect, a machine-readable medium includes instructions that, when executed, perform a method of reading a flash memory with an adjusted read level. In this regard, the method may include identifying a current read level associated with determining between cell distributions in a plurality of multi-level memory cells, setting the current read level to a new read level associated with increasing a chance of error of determining cells in a first cell distribution, to decrease a chance of error of determining cells in a second cell distribution, performing a page operation to determine a group of cells at the first or second distribution, determining probability values corresponding to the group of cells, and providing the group of cells and the probability values to a decoder.

In a further aspect, a system may include a memory having stored thereon a plurality of programming levels and corresponding unique level distributions, a memory interface configured to be operably coupled to the memory, a decoder, and a page operation unit operably coupled to the memory interface and the decoder. In this regard, the page operation unit may be configured to identify the current read level associated with determining a most significant bit in a plurality of multi-level memory cells, set the current read level to a new read level associated with increasing a first error rate, the first error rate associated with determining that the most significant bit is a first binary value, to decrease a second error rate associated with determining that the most significant bit is a second binary value, read a memory cell with the new read level to determine a most significant bit value of the memory cell, determine a probability value associated with the most significant bit value, and provide the most significant bit value and the probability value to a decoder.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Figure 1:
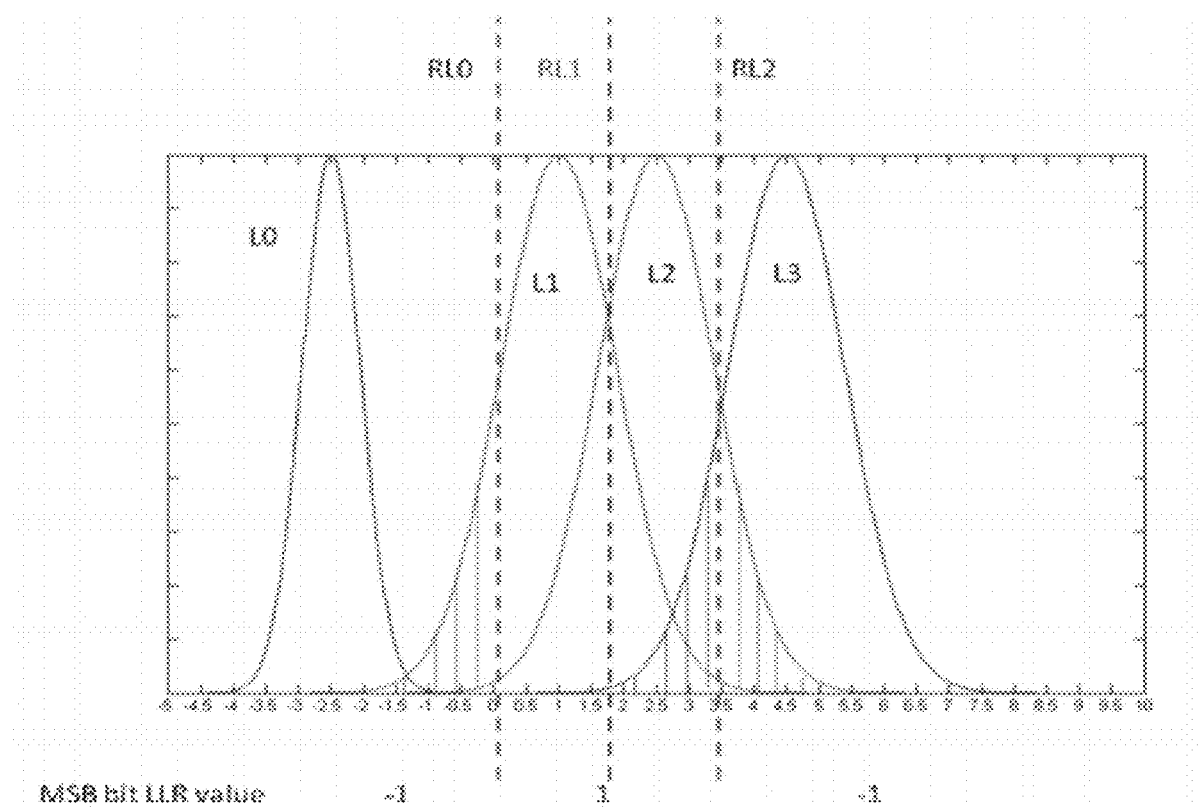
FIG. 1 is an exemplary graph diagram of four possible distributions of cell programming levels and associated read levels for a group of memory cells in a MLC flash memory according to one aspect of the subject technology.

FIG. 1 is an exemplary graph diagram of four possible distributions of cell programming levels and associated read levels for a group of memory cells in a MLC flash memory according to one aspect of the subject technology. A MLC NAND cell is capable of storing four levels of charge per cell: an erased level L0, and programmed levels L1, L2, and L3. These four states yield two logical bits of information per cell, the Most Significant Bit (MSB) and Least Significant Bit (LSB). In a group of cells, these two bits may make up corresponding MSB and LSB pages of a memory block. In some aspects, a NAND memory block is programmed one page at a time using an Incremental Step Programming Procedure (ISSP) and erased using a similar Incremental Step Erase Procedure (ISEP). The memory cells that are to be programmed may be selected at the bit line, and a "page operation" may be performed to apply a voltage at the gates of each cell in the memory page. A corresponding selection at the bit lines creates a voltage potential in the selected group of memory cells where the LSB or MSB is selected to be different (for example, binary 10 or 00) than the erased L0 distribution state (for example, binary 11).

During programming of the cell, the threshold voltages $V_T$ of the selected group of cells are increased to create a LSB distribution. Then, in a similar manner, during a MSB page program operation, the ISPP is applied to create an L1 distribution from the erased L0 distribution (for example, binary 01), or, an L2 distribution (for example, binary 00) or L3 distribution (for example, binary 10) from the previously programmed LSB distribution. In some aspects, all of the above distributions are created from the L0 distribution by applying a series of voltage pulses to the memory cells of the page which is being programmed.

After ISPP, the mean of each of the distributions are suitably spaced from adjacent read levels RL0, RL1, and RL2. In some aspects, spacing can be altered by setting program verify voltages during verification operations sufficiently higher than a lower read level, but sufficiently low enough to prevent a majority of those cells in the distribution having a higher $V_T$ from crossing the next higher read level. To ensure that most, if not all, of the cells in a distribution will conduct, a read level greater than the distribution is applied. In this regard, RL0 will cause cells in distribution L0 to conduct, RL1 will cause cells in distribution L1 to conduct, RL2 will cause cells in distribution L2 to conduct, and so on. Where, as depicted by FIG. 1, only four states are available, RL2 will not cause any cells in distribution L3 to conduct, thereby indicating a binary 1 in the MSB for those cells. Generally, for N distributions there will be N−1 read levels. In the depicted example, there are four distributions (of states) and three read levels. Those skilled in the art will recognize that there may be eight, sixteen, or more distributions without departing from the scope of the subject technology.

As a flash memory is cycled (that is, programmed and erased repeatedly), its physical qualities change. For example, the repeated placement and removal of electrons on the floating gate during programming and erase operations, respectively, causes some excess electrons to be trapped in the device, and, when one or multiple cells are programmed, electrons may leak into neighboring cells after prolonged stress due to the voltages at the gates of neighboring cells. This noise may cause the threshold voltages of these memory cells to eventually take values that are different (higher or lower) than expected values, and, as the cells age, the distributions of the programmed voltages may become wider and/or drift. When the $V_T$ of some of the cells in the distributions begin to cross higher or lower read levels, the likelihood that a read operation will produce an error increases.

Figure 2:
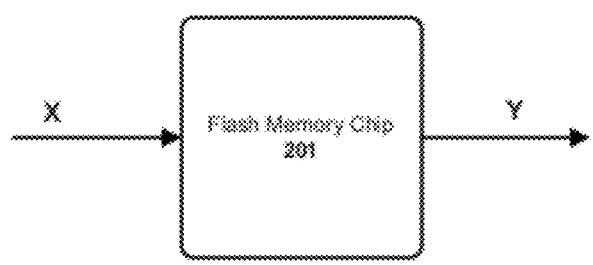
FIG. 2 is a block diagram illustrating programming and reading from a multi-level cell flash memory according to one aspect of the subject technology.

FIG. 2 is a block diagram illustrating programming and reading from a multi-level cell flash memory according to one aspect of the subject technology. A MLC flash memory cell 201 may be programmed using a program (write) voltage level X (for example, 0, 1, 2, 3) to create a 2-bit binary value. The value representative of the program and/or output level may be an actual voltage level (for example, 0.3 V, 2.5 V, or the like) or a fixed level (for example, 0, 2, 1, 3) corresponding to the voltage level made available by the flash memory. As described previously, on performing a read of the cell, due to changing conditions of the memory cell, the perceived output level Y may not take on the same or equivalent value X.

Sample distributions L0, L1, L2, and L3 corresponding to sample program voltage level X=$x_0$, $x_1$, $x_2$, and $x_3$ may be generated based on test and/or simulation data and stored in memory. When an output level Y is received, a page operation unit (see FIG. 3) may generate a probability that the output level Y corresponds to the programming level it purports to be. In some aspects, the probability value generated may be used to generate one or more tog domain probability values (for example, a log likelihood ratio). For example, one or more bits may be generated to represent a log domain probability for the least significant bit (LSB) of the MLC cell, and another one or more bits generated to represent a log domain probability of the most significant bit (MSB) of the MLC cell. These log domain ratios may be used in conjunction with a demodulator to determine whether the actual bits received from the flash memory are accurate. The demodulated bits may then be forwarded to a hard or soft decoder for error correction.

In low-density parity-check (LDPC) applications, for example, a log likelihood ratio (LLR) may include the logarithm of a ratio between the probability of a bit being "0" or "1". A positive LLR may generally indicate that a signal read from the memory cell is likely to be a 0-bit, and a negative LLR may generally indicates that a signal read from the memory cell is likely to be a 1-bit. An LLR may be assigned to the bit value read from the memory cell. A bit having an assigned LLR equal to five may be more likely to be a 0 than a bit having an assigned LLR equal to 1. A bit having an assigned LLR equal to zero may be equally likely to be a 1 or a 0 bit.

If, at a certain read level, a 0-bit is read from a memory cell then a positive LLR may be assigned. If a 1-bit is read then a negative value may be assigned. In a multi-level memory cell having two bits, there are multiple potential cell distribution levels (for example, L0, L1, L2, and L3). Distinguishing between a 0 and a 1 in a read of a MSB may require determinations across multiple read level boundaries. In the example of FIG. 1, distinguishing between a 0 and a 1 requires determining whether the cell conducts within the middle two distributions L1 and L2 (for a binary 0x), or in the end distributions L0 and L3 (for a binary 1x). Accordingly, multiple read level thresholds may be involved (for example, RL0 and RL2) to make that determination.

A determination that a MSB has a binary value of 1 may include the memory cell not conducting in one of two distributions (for example, L0 or L3). However, a LDPC decoder does not account for which read level threshold was used to determine the programmed level of the memory cell, and an LLR value may be assigned equally to readings from both distributions. For example, the same reliability (for example, LLR value) may be assigned to the upper distribution L3 or lower distribution L0. Moreover, LLR values may be symmetrically assigned to MSB and LSB, respectively. For example, as depicted by FIG. 1, a certain negative value (for example, LLR equivalent to −1) may be assigned to distributions associated with the MSB (for example, L0 and L3), and a positive value of equal magnitude (for example, LLR equivalent to +1) assigned to distributions associated with the LSB (for example, L1 and L2).

A multi-level memory cell may be created by the manufacturer to include threshold voltages less than zero, and may be read with a read level of zero volts (for example, for a binary 11). As voltage levels shift over time and cycling, programming distributions may drift. In a MSB read, cells in a second programming distribution L1 (for example, for a binary 01) may drift below the 0 voltage potential, thus creating an increased error rate when using a first read level threshold at zero volts to distinguish between the first programming distribution L0 (for example, corresponding to a 1-bit) and the second programming distribution L1 (for example, corresponding to a 0-bit). Similarly, cells in a fourth programming distribution L3 (for example, corresponding to a 1-bit) may drift below read level RL2 causing further potential errors. Notwithstanding this deficiency, the LLR value assigned to the MSB read may remain static even though, as the distributions become more skewed, the error rate produced by the hard decoder may increase. A bottleneck is created when the hard decoder produces too many errors for an associated soft decoder to handle.

Figure 3:
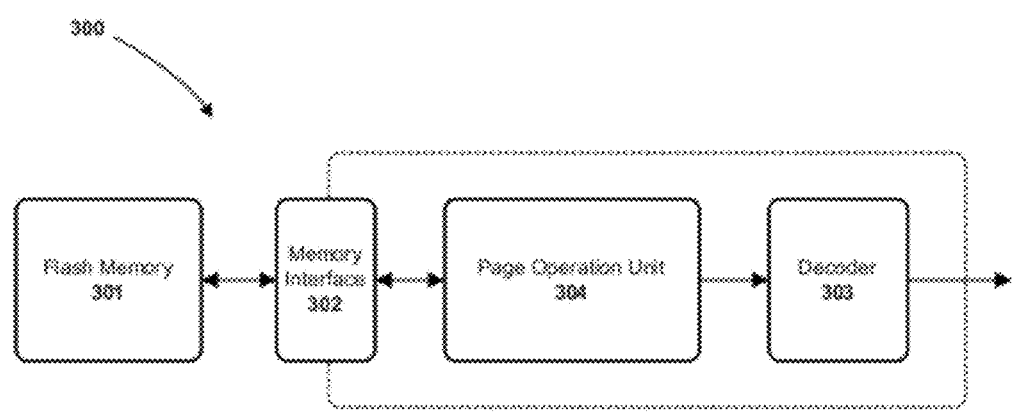
FIG. 3 is a block diagram illustrating components of a flash memory storage system, including a system for reading a flash memory, according to one aspect of the subject technology.

FIG. 3 is a block diagram illustrating components of a flash memory storage system, including a system 300 for reading a flash memory, according to one aspect of the subject technology. System 300 may include a memory 301, a memory interface 302 configured to be operably coupled to memory 301, a decoder 303, and a page operation unit 304. Page operation unit 304 may be operably coupled to memory interface 302 and decoder 303. In some aspects, page operation unit 304 may be configured to identify (for example, lookup, select, determine, or the like) the current read level associated with determining a MSB in a plurality of multi-level memory cells. In one example, the current read level may include previously described read level RL2, associated with determining cells programmed to the previously described fourth distribution L3. In another example, the current read level may be previously described read level RL0, associated with determining cells programmed to first distribution L0 (for example, by causing them to conduct at 0 volts). In this regard, distributions L0 and/or L3 may represent one bit value (for example, a MSB equivalent to 1), and distributions L1 and L2 may represent another bit value (for example, a MSB equivalent to 0), with RL0 and/or RL2 determining between the two bit values.

Figure 4:
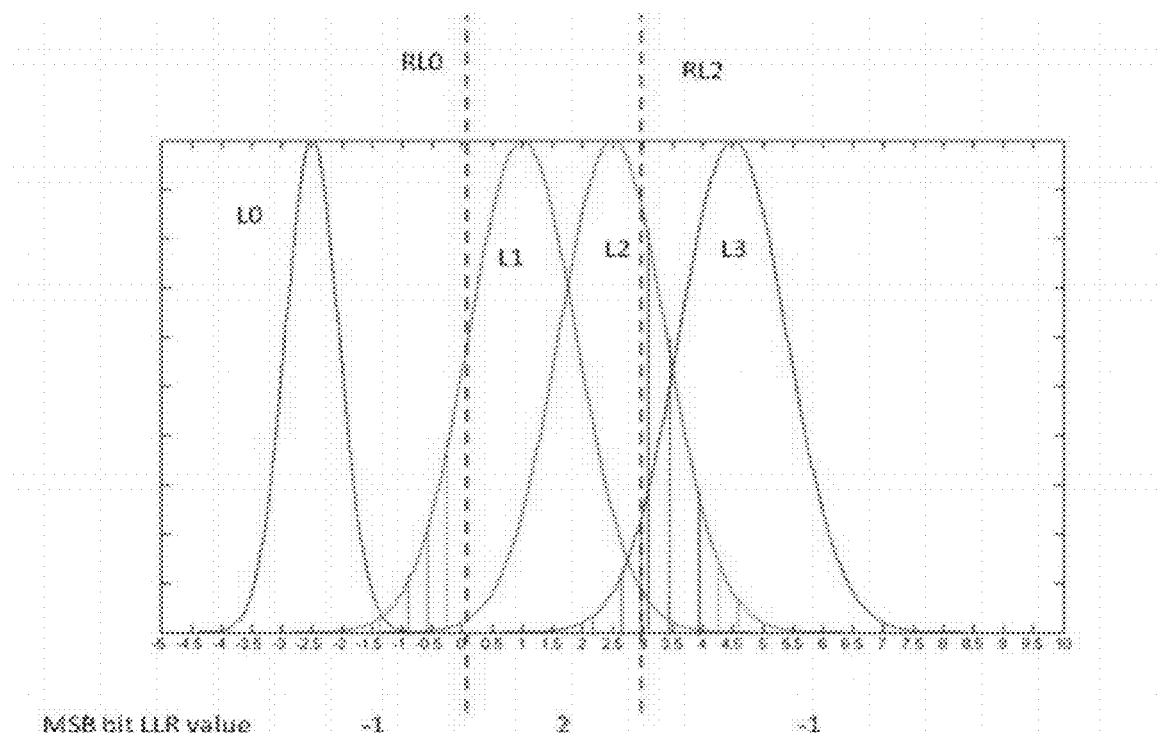
FIG. 4 is an exemplary graph diagram of four possible distributions of cell programming levels, and an adjusted read level, for a group of memory cells in a MLC flash memory according to one aspect of the subject technology.

FIG. 4 is an exemplary graph diagram of four possible distributions of cell programming levels, and an adjusted read level, for a group of memory cells in a MLC flash memory according to one aspect of the subject technology. A page operation unit (for example, page operation unit 304) may be configured to reset a current read level (for example, RL2 of FIG. 1) to a new read level (for example, from 3.5 to 3.0 volts). As described previously, when the most significant bits in a page of memory are determined, a number of errors may be produced from cells whose programming levels have drifted into the boundaries of an adjacent cell distribution level (for example, from L3 to L2). The new read level may increase a first error rate associated with determining that the most significant bit is a first binary value (for example, a binary one) and decrease a second error rate associated with determining that the most significant bit is a second binary value (for example, a binary zero).

In the example of FIG. 4, decreasing RL2 and performing a read operation may cause cells at the higher end of distribution L2 to improperly be read as belonging to distribution L3. If distribution L3 is associated with a binary one, and distribution L2 is associated with a binary zero, then some cells actually programmed to binary zero will read as being programmed to a binary one, and vice versa. However, decreasing RL2 may commensurately decrease the possibility of cells in the lower end of distribution L3 from being improperly read as belonging to distribution L2. Error rates may be realized (or expected to be realized), for example, when demodulating or decoding of a group of memory cells (for example, a page or block).

In one aspect, the current read level (for example, RL2) may be initially set at a lower value to accommodate future drift. In another aspect, the current read level may be lowered, for example, to account for a previous drift in programming level over time. For example, the current read level may be adjusted to the new read level after a predetermined number of program/erase cycles associated with the memory cell, and/or after a predetermined cycle or retention time associated with the memory cell. In one example, the new read level, or read level adjustment, may be stored in a lookup table by a number of program/erase cycles or cycle or retention time period. The number of program/erase cycles or time period associated with each adjustment or value may be determined based on prior simulation data and associated with a block or blocks of memory, page of memory, or the like. In the same regard, an amount of adjustment to the read level may be based on a function of cycle time or retention time.

The page operation unit may be configured to read a memory cell with the new read level to determine a most significant bit value of the memory cell, determine a probability value associated with the most significant bit value (for example, the value may be generated or retrieved from a lookup table), and then provide the most significant bit value and the probability value to a decoder (for example, decoder 303). The probability value may be representative of a likelihood (for example, a log-likelihood ratio) that the most significant bit value is equal to a programmed level of the memory cell. In this regard, the probability value may be representative of a higher probability if the most significant bit value is equal to a second binary value (for example, a binary zero) than if the most significant bit value is equal to a first binary value (for example, a binary one). In the example of FIG. 4, the probability value assigned to a MSB reading of binary 0 is set to 2 while the probability value assigned to a MSB reading of binary 1 remains set at −1 (for example, compared to FIG. 1).

The previously described probability values may be asymmetric, for example, commensurate with expected error rates resulting from the adjustment to the current read level. For example, if the current read level is adjusted such that the error rate increases for reading a certain bit value (for example, decreasing RL2 to increase the error rate in reading a most significant bit value of one) then the probability value may be represented by a lower value. If the current read level is adjusted such that the error rate decreases for reading a certain bit value (for example, decreasing RL2 to decrease the error rate in reading a most significant bit value of zero) then the probability value may be represented by a higher value. In this regard, the probability values corresponding to L1 and L2 (for example, the middle regions of FIG. 4) are increased so that an LLR-based decoder (for example, an LDPC decoder) works less when a binary 0 is received from the MSB read instead of a binary 1. A read of the middle region (LSB) may have a higher likelihood of being a correct read, improving LDPC decoding even though a likelihood that L2 may be interpreted as L3 (for example, in a MSB read) may be increased.

Alternatively, RL2 may be moved higher to mirror RL0, such that when the MSB is read as equivalent to a binary 1 (L0 or L3) it is more reliable (for example, for either distribution), and when the MSB is read as equivalent to a binary 0 (L1 or L2) it is less reliable. Different LLRs may be assigned to an MSB that is read as equivalent to a binary 1 (high LLR magnitude) than an MSB that is read as equivalent to a binary 0 (low LLR magnitude), other than a sign difference. In this regard, an LLR-based decoder may naturally treat them differently and reduce the overall error rate, even though the raw bit error may increase.

A simulation was performed by adjusting the read levels of a flash channel model (57.5K cycle and 3 hr baking at 100 C). The LLRs generated for an MSB read were given positive values of 2 and negative values of −1.

TABLE 1

| Condition | Raw BER | SFR after decoder |
|---|---|---|
| Default (positive thresholds only and LLRs are +1 and −1) | 7.6e−3 | 3.75e−3 |
| Threshold RL2 shifted 0.2 V | 8.83e−3 | 8.75e−3 |
| Threshold RL2 shifted 0.1 V | 8.2e−3 | 5e−4 |

At default conditions, a sector failure rate of 3.75e−3 was observed. When RL2 was adjusted (moved) by 100 mV according to the subject technology, the sector failure rate was improved by nearly a decade. The improvement resulted even though the raw error rate actually increased.

Figure 5:
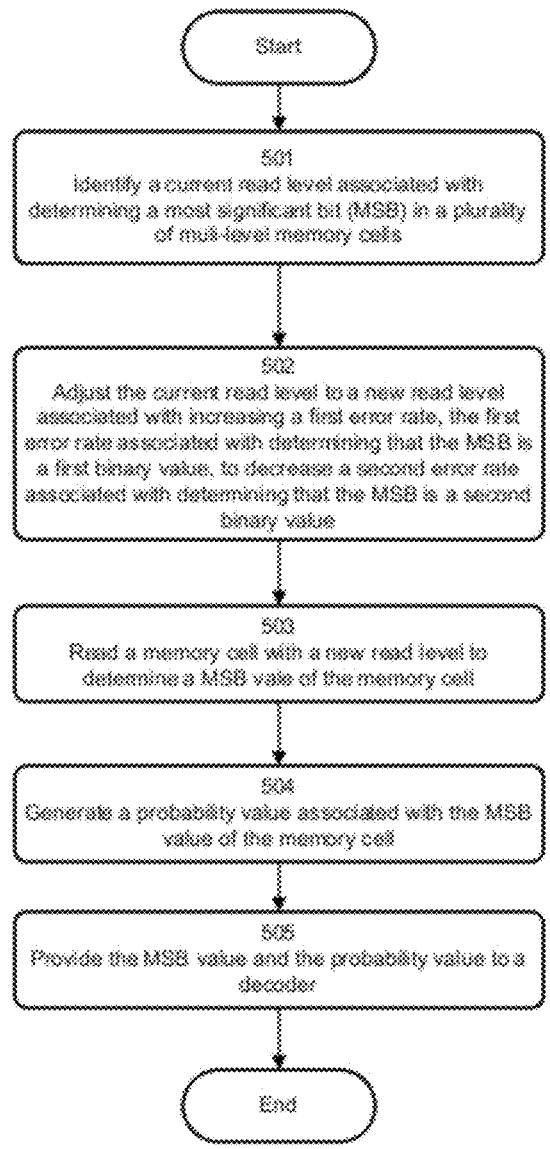
FIG. 5 is a flowchart illustrating a method of determining a probability that a memory cell was programmed to a certain input level according to one aspect of the subject technology.

FIG. 5 is a flowchart illustrating a method of determining a probability that a memory cell was programmed to a certain input level according to one aspect of the subject technology. At 501, a current read level associated with determining a most significant bit in a plurality of multi-level memory cells is identified. At 502, the current read level is adjusted to a new read level associated with increasing a first error rate, the first error rate associated with determining that the most significant bit is a first binary value, to decrease a second error rate associated with determining that the most significant bit is a second binary value. At 503, a memory cell is read with the new read level to determine a most significant bit value of the memory cell. At 504, a probability value associated with the most significant bit value is generated. And, at 505, the most significant bit value and the probability value are provided to a decoder.

Figure 6:
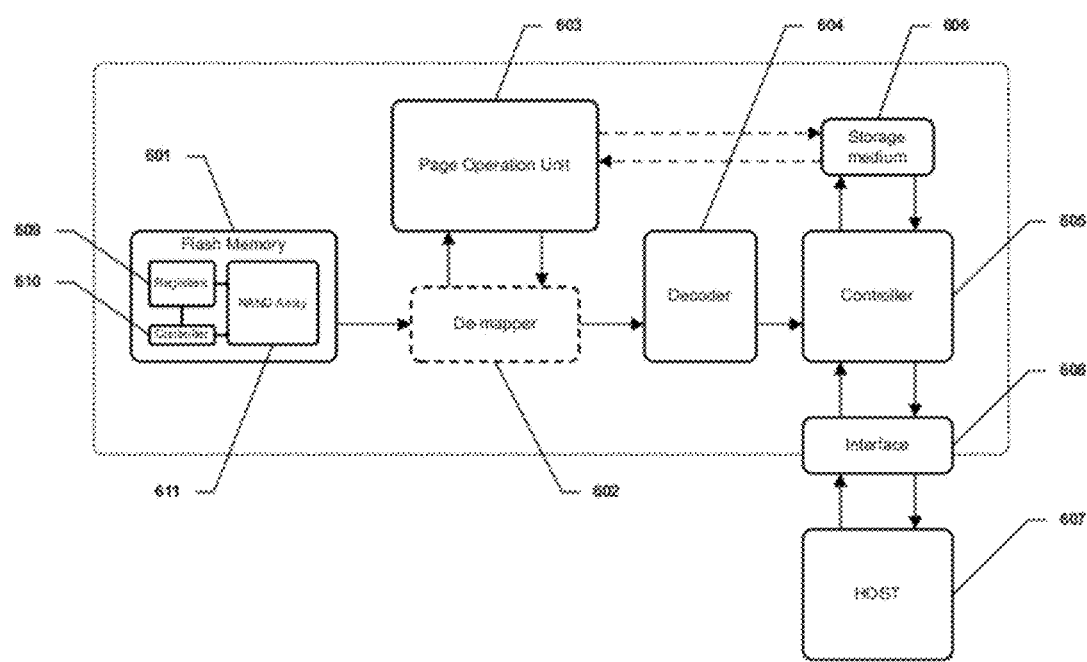
FIG. 6 is a block diagram illustrating components of a flash memory storage system, including a page operation unit, according to one aspect of the subject technology.

FIG. 6 is a block diagram illustrating components of a flash memory storage system, including a page operation unit, according to one aspect of the subject technology. A flash memory storage system 600 (for example, a solid state drive) may include a flash memory 601, a memory demapper 602 (a demodulator) and page operation unit 603, an ECC decoder 604 (for example, LDPC code or BCH code), and a data storage controller 605. Page operation unit 603 and/or controller 605 may use a storage medium 606 for temporary storage of data and information. Demapper 602 may be used in page-based systems (and may be called a detector for level-based system like TCM) to modulate/demodulate bit mappings from flash memory 601 to other components of system 600. Demapper 602 is optional, and, when omitted, page operation unit 603 may directly receive data from flash memory 601. Alternatively, demapper 602 may be integrated with decoder 604. Page operation unit 603 may also be integrated with decoder 604 or other component of system 600. Decoder 604 may be used to decode the data before sending it to controller 605. Page operation unit 603 may be configured to perform a read operation on one or more cells of flash memory 601 (for example, a page or block) and then assign a different log likelihood ratio for different error events.

The internal components (for example, processor, internal memory, and the like) for demapper 602, page operation unit 603, decoder 604, and controller 605 are described herein for convenience as one device, with specific reference to page operation unit 603. However, one skilled in the art will recognize that these devices may be separate elements on their own PC boards, and each may include many similar internal hardware components. Accordingly, it is the intention that any one of these devices (for example, page operation unit 603 and controller 605) may be described in a same or similar manner and/or perform the same or similar logic and/or functionality. For example, demapper 602 and/or decoder 604 may be responsible for determining and applying the previously described log likelihood ratios. In some aspects, demapper 602 and decoder 604 may include similar functionality and may be referred to interchangeably in this disclosure.

Page operation unit 603 may include several internal components (not shown) such as a read-only memory, a flash component interface (for example, a multiplexer to manage instruction and data transport along a serial connection to flash memory 601), an I/O interface, error correction circuitry, and the like. In some aspects, all of these internal elements of page operation unit 603 may be integrated into a single chip. In other aspects, these elements may be separated on their own PC board. Page operation unit 603 may include a processor configured to execute code or instructions to perform the operations and functionality described herein, including implementing the previously described algorithm. In other aspects, a separate processor (for example, a processor of controller 605) may be responsible for executing the same. The processor may be configured to monitor and/or control the operation of the components in page operation unit 603. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on RUM within page operation unit 603 and/or its processor. One or more sequences of instructions may be software stored and read from a storage medium (for example, storage medium 607), flash memory 601, or received from a host device (for example, from host 607 via a host interface 608). ROM, storage medium 607, and flash memory 601 represent some examples of machine or computer readable media on which instructions/code executable by page operation unit 603 and/or its processor may be stored. Machine or computer readable media may generally refer to any medium or media used to provide instructions to page operation unit 603 and/or its processor, including volatile media, such as dynamic memory used for storage media 102 or for buffers within page operation unit 603, and non-volatile media, such as electronic media, optical media, and magnetic media.

In one aspect, controller 605 may be configured to store data received from a host device 607 in flash memory 601 in response to a write command from host device 607. Controller 605 may be further configured to read data stored in flash memory 601 and to transfer the read data to page operation unit 603 and then ultimately to host device 607 in response to a read command from host device 607. Host device 607 may represent any device configured to be coupled to data storage system 600 and configured to store data in system 600. Host device 607 may be a computing system such as a personal computer, a server, a workstation, a laptop computer, PDA, smart phone, and the like. Alternatively, host device 607 may be an electronic device such as a digital camera, a digital audio player, a digital video recorder, and the like.

Host interface 608 may be integrated with system 600 and configured to be operably coupled (for example, by wired or wireless connection) to host device 607, to receive data from host device 607 and to send data to host device 607. Host interface 607 may include electrical and physical connections, or a wireless connection, for operably coupling host device 607 to controller 605 (for example, via the interface of controller 605). Host interface 608 may be configured to communicate data, addresses, and control signals between host device 607 and controller 605. Alternatively, the interface of controller 605 may include and/or be combined with host interface 608. Host interface 608 may be configured to implement a standard interface, such as Serial-Attached SCSI (SAS), Fiber Channel interface, PCI Express (PCIe), SATA, USB, and the like. Host interface 608 may be configured to implement only one interface. Alternatively, host interface 608 (and/or the I/O interface of controller 605) may be configured to implement multiple interfaces, which may be individually selectable using a configuration parameter selected by a user or programmed at the time of assembly. Host interface 608 may include one or more buffers for buffering transmissions between host device 609 and controller 605.

In some aspects, storage medium 607 represents volatile memory used to temporarily store data and information used to manage data storage system 600. According to one aspect of the subject technology, storage medium 607 is random access memory (RAM) such as double data rate (DDR) RAM. Other types of RAM also may be used to implement storage medium 607. Memory 607 may be implemented using a single RAM module or multiple RAM modules. While storage medium 607 is depicted as being distinct from page operation unit 603 and controller 605, those skilled in the art will recognize that storage medium 607 may be incorporated into page operation unit 603 and/or controller 605 without departing from the scope of the subject technology. Alternatively, storage medium 607 may be a non-volatile memory such as a magnetic disk, flash memory, peripheral SSD, and the like.

Flash memory 601 represents a non-volatile memory device for storing data. According to one aspect of the subject technology, flash memory 601 includes, for example, a NAND flash memory. Flash memory 601 may include a single flash memory device or chip, or may include multiple flash memory devices or chips arranged in multiple channels. Flash memory 601 is not limited to any particular capacity or configuration. For example, the number of physical blocks, the number of physical pages per physical block, the number of sectors per physical page, and the size of the sectors may vary within the scope of the subject technology.

Flash memory may have a standard interface specification. This standard ensures that chips from multiple manufacturers can be used interchangeably (at least to a large degree). The interface hides the inner working of the flash and returns only internally detected bit values for data. In one aspect, the interface of flash memory 601 is used to access one or more internal registers 609 and an internal flash controller 610 for communication by external devices. In some aspects, registers 609 may include address, command, and/or data registers, which internally retrieve and output the necessary data to and from a NAND memory cell array 611. For example, a data register may include data to be stored in memory array 611, or data after a fetch from memory array 611, and may also be used for temporary data storage and/or act like a buffer. An address register may store the memory address from which data will be fetched to host 607 or the address to which data will be sent and stored. In some aspects, a command register is included to control parity, interrupt control, and the like. In some aspects, internal flash controller 610 is accessible via a control register to control the general behavior of flash memory 601. Internal flash controller 610 and/or the control registers 609 may control the number of stop bits, word length, receiver clock source, and may also control switching the addressing mode, paging control, coprocessor control, and the like.

In some aspects, registers 609 may also include a test register. The test register may be accessed by specific addresses and/or data combinations provided at the interface of flash memory 601 (for example, by specialized software provided by the manufacturer to perform various tests on the internal components of the flash memory). In further aspects, the test register may be used to access and/or modify other internal registers, for example the command amid/or control registers. In some aspects, test modes accessible via the test register may be used to read, input or modify certain programming conditions of flash memory 601 (for example, determine read levels) to dynamically vary how data is read from the memory cells of memory arrays 612.

It should be understood that in all cases data may not always be the result of a command received from host 607 and/or returned to host 607. In some aspects, page operation unit 603 and/or controller 605 may be configured to execute a read operation independent of host 607. The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A computer-implemented method of reading a flash memory with an adjusted read level, the method comprising:
    identifying a current read level associated with determining a most significant bit in a plurality of multi-level memory cells;
    setting the current read level to a new read level associated with increasing a first error rate, the first error rate associated with determining that the most significant bit is a first binary value, to decrease a second error rate associated with determining that the most significant bit is a second binary value;
    reading a memory cell with the new read level to determine a most significant bit value of the memory cell;
    determining a probability value associated with the most significant bit value; and
    providing the most significant bit value and the probability value to a decoder.

2. The computer-implemented method of claim 1, wherein the probability value is representative of a likelihood that the most significant bit value is equal to a programmed level of the memory cell, and wherein the probability value is representative of a higher probability if the most significant bit value is equal to the second binary value than if the most significant bit value is equal to the first binary value.

3. The computer-implemented method of claim 1, wherein the first binary value is a binary one and the second binary value is a binary zero.

4. The computer-implemented method of claim 1, wherein each of the plurality of memory cells is programmed to one of four programming levels, a first and fourth programming levels being associated with the first binary value and a second and third programming levels being associated with the second binary value, and wherein the current read level is a voltage level sufficient to read a majority of memory cells programmed to the fourth programming level.

5. The computer-implemented method of claim 1, wherein the probability value is a log-likelihood ratio.

6. The computer-implemented method of claim 1, wherein the current read level is adjusted to the new read level after a predetermined number of program/erase cycles associated with the memory cell.

7. The computer-implemented method of claim 1, wherein the current read level is adjusted an amount based on a cycle time associated with the memory cell.

8. The computer-implemented method of claim 1, wherein the current read level is adjusted to the new read level after a predetermined retention time associated with the memory cell.

9. The computer-implemented method of claim 1, wherein the current read level is adjusted an amount based on a retention time associated with the memory cell.

10. The computer-implemented method of claim 1, wherein the new read level is representative of a lower voltage level than the current read level.

11. The computer-implemented method of claim 1, wherein determining the probability value includes retrieving the probability value from a lookup table.

12. The computer-implemented method of claim 1, wherein setting the current read level to a new read level includes:
    retrieving an adjustment to the current read level from a lookup table; and
    adjusting the current read level according to the adjustment.

13. A machine-readable medium having instructions that, when executed, perform a method of reading a flash memory with an adjusted read level, the method comprising:
    identifying a current read level associated with determining between cell distributions in a plurality of multi-level memory cells;
    setting the current read level to a new read level associated with increasing a chance of error of determining cells in a first cell distribution, to decrease a chance of error of determining cells in a second cell distribution;

performing a page operation to determine a group of cells at the first or second distribution;

determining probability values corresponding to the group of cells; and providing the group of cells and the probability values to a decoder.

14. The machine-readable medium of claim 13, wherein the first cell distribution is representative of cells having a most significant bit value of a binary one, and wherein the second cell distribution is representative of cells having a most significant bit value of a binary zero.

15. The machine-readable medium of claim 13, wherein the probability values are representative of a likelihood that a current level of a memory cell is equal to a programmed level of the memory cell, and wherein the probability values are representative of a higher probability if corresponding memory cells are read to be in the second distribution than if the corresponding memory cells are read to be in the first distribution.

16. The machine-readable medium of claim 13, wherein determining between cell distributions in a plurality of multi-level memory cells includes determining between logical bit values of a most significant bit.

17. The machine-readable medium of claim 13, wherein the chance of error of determining cells in the first cell distribution and the chance of error of determining cells in the second cell distribution are realized at the decoder.

18. The machine-readable medium of claim 13, wherein determining the probability values includes retrieving the probability values from a lookup table.

19. The machine-readable medium of claim 1, wherein setting the current read level to a new read level includes:

retrieving an adjustment to the current read level from a lookup table; and adjusting the current read level according to the adjustment.

20. A system, comprising:

a memory, the memory having stored thereon a plurality of programming levels and corresponding unique level distributions;

a memory interface configured to be operably coupled to the memory;

a decoder; and a page operation unit operably coupled to the memory interface and the decoder, wherein the page operation unit is configured to:

identify the current read level associated with determining a most significant bit in a plurality of multi-level memory cells;

set the current read level to a new read level associated with increasing a first error rate, the first error rate associated with determining that the most significant bit is a first binary value, to decrease a second error rate associated with determining that the most significant bit is a second binary value;

read a memory cell with the new read level to determine a most significant bit value of the memory cell;

determine a probability value associated with the most significant bit value; and provide the most significant bit value and the probability value to a decoder.

21. The system of claim 20, wherein the probability value is representative of a likelihood that the most significant bit value is equal to a programmed level of the memory cell, and wherein the probability value is representative of a higher probability if the most significant bit value is equal to the second binary value than if the most significant bit value is equal to the first binary value.

22. The system of claim 20, wherein the first binary value is a binary one and the second binary value is a binary zero.

23. The system of claim 20, wherein each of the plurality of memory cells is programmed at one of four programming levels, a first and fourth programming levels being associated with the first binary value and a second and third programming levels being associated with the second binary value, and wherein the current read level is a voltage level sufficient to read a majority of memory cells programmed at the fourth programming level.

24. The system of claim 20, wherein the probability value is a log domain probability.

* * * * *